United States Patent
Ivanov

(10) Patent No.: US 7,146,703 B2
(45) Date of Patent: Dec. 12, 2006

(54) LOW TEMPERATURE SPUTTER TARGET/BACKING PLATE METHOD AND ASSEMBLY

(75) Inventor: Eugene Y. Ivanov, Grove City, OH (US)

(73) Assignee: Tosoh SMD, Grove City, OH (US)

(*) Notice: Subject to any disclaimer, the term of this patent is extended or adjusted under 35 U.S.C. 154(b) by 132 days.

(21) Appl. No.: 10/433,181

(22) PCT Filed: Dec. 17, 2001

(86) PCT No.: PCT/US01/49126

§ 371 (c)(1),
(2), (4) Date: May 29, 2003

(87) PCT Pub. No.: WO02/49785

PCT Pub. Date: Jun. 27, 2002

(65) Prior Publication Data

US 2004/0113364 A1   Jun. 17, 2004

Related U.S. Application Data

(60) Provisional application No. 60/255,873, filed on Dec. 18, 2000.

(51) Int. Cl.
*B23P 11/00*   (2006.01)
*C23C 14/34*   (2006.01)

(52) U.S. Cl. .............. 29/521; 29/525; 204/298.12; 204/298.13

(58) Field of Classification Search .............. 29/521, 29/525, 557; 204/298.12, 298.13
See application file for complete search history.

(56) References Cited

U.S. PATENT DOCUMENTS

| 4,204,936 | A | * | 5/1980 | Hartsough | .............. 204/192.12 |
| 4,885,075 | A |   | 12/1989 | Hillman | |
| 5,230,459 | A |   | 7/1993 | Mueller et al. | |
| 5,269,899 | A |   | 12/1993 | Fan | |
| 5,836,506 | A |   | 11/1998 | Hunt et al. | |
| 6,071,389 | A |   | 6/2000 | Zhang | |
| 6,725,522 | B1 | * | 4/2004 | Ivanov et al. | .................. 29/525 |
| 6,749,103 | B1 | * | 6/2004 | Ivanov et al. | ............... 228/115 |

FOREIGN PATENT DOCUMENTS

EP   0 590 904 A1   4/1994

* cited by examiner

*Primary Examiner*—Jermie E. Cozart
(74) *Attorney, Agent, or Firm*—Wegman, Hessler & Vanderburg

(57) ABSTRACT

A sputtering target and a backing plate are diffusion-bonded with or without an insert or inserts interposed there-between so as to have a solid phase diffusion-bonded interface. The sputtering target substantially maintains its metallurgical characteristic and properties even though it has been diffusion-bonded to the backing plate. The solid-diffusion bonding of the target and backing plate, is achieved at a low temperature and pressure and results in interdiffusion of constituent atoms to attain high adhesion and bond strength without attendant deterioration or large deformation of the target material, while inhibiting the crystal growth in the target material. The bond undergoes no abrupt decrease in bond strength upon elevation of the service temperature. One hundred percent bonding is achieved with non-bonded portions such as pores left along the interface.

13 Claims, 6 Drawing Sheets

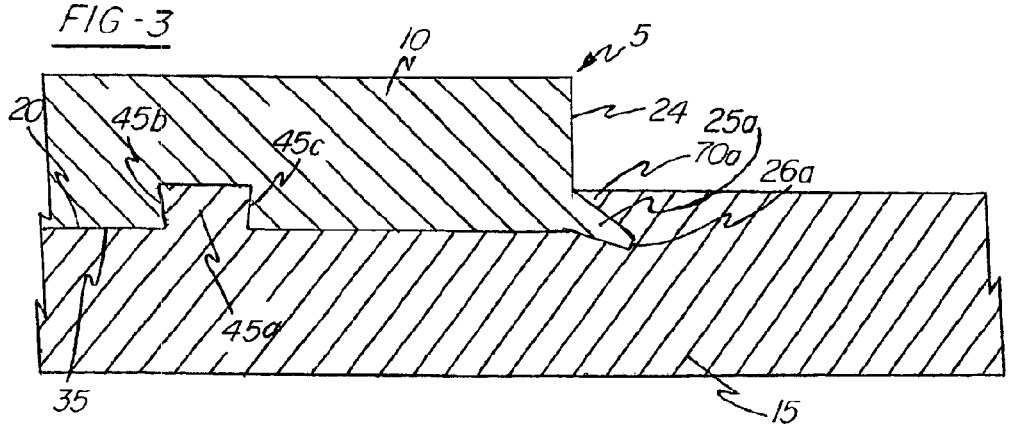
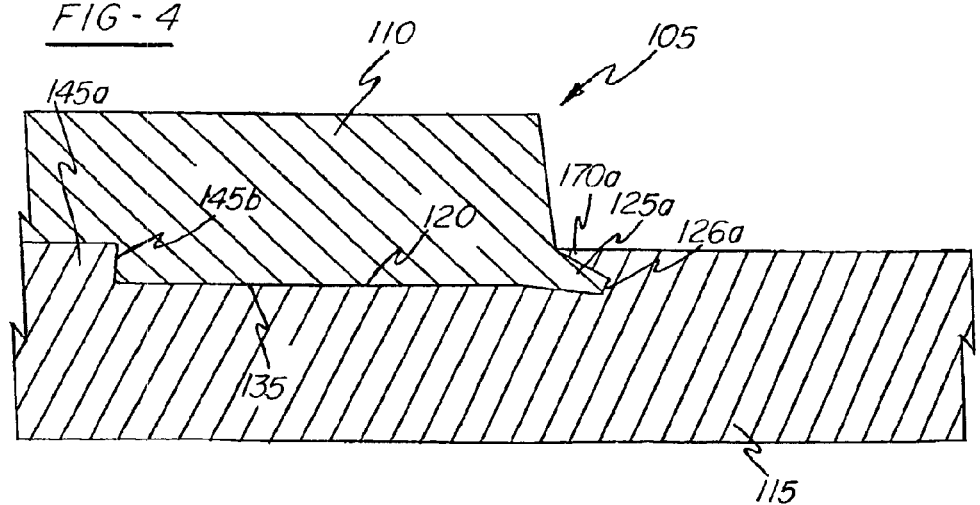

LOW TEMPERATURE SPUTTER TARGET/BACKING PLATE METHOD AND ASSEMBLY

CROSS-REFERENCE TO RELATED APPLICATION

Priority filing benefit of (1) International PCT application PCT/USO1/49126 filed Dec. 17, 2001, and published under PCT 21(2) in the English language and (2) U.S. provisional application Ser. No. 60/255,873 filed Dec. 18, 2000 is hereby claimed.

FIELD OF THE INVENTION

The present invention relates to sputter target assemblies for use within sputtering systems. More specifically, the present invention pertains to sputter target assemblies which include a target material bonded by low temperature pressure consolidation to a backing plate material with a mechanical bond around the periphery thereof.

BACKGROUND OF THE INVENTION

Cathodic sputtering is widely used for the deposition of a thin film, or layer, of material onto desired substrates. The sputtering process employs gas ion bombardment of a target material having a face formed of a material that is to be deposited as a thin film, or layer, on the given substrate. Ion bombardment of the target material not only causes atoms or molecules of the target material to be sputtered, it imparts considerable thermal energy to the sputter target assembly. This heat is typically dissipated by use of a cooling fluid circulated beneath, through or around a thermally conductive, non-magnetic, backing plate material that is positioned in heat exchange relation with the target material.

The target material and backing plate material form a part of a cathode assembly which, together with an anode, is placed in an evacuated chamber that contains an inert gas, preferably argon. A high voltage electrical field is applied across the cathode and anode. The inert gas is ionized by collision with the electrons ejected from the cathode. Positively charged gas ions are attracted to the cathode and, upon impingement with the target material surface, dislodge the target material. The dislodged target material traverses the evacuated enclosure and deposits, as a thin film, or layer, on the given substrate. The substrate is normally located proximate the anode within the evacuated chamber.

In addition to the use of an electrical field, increased sputtering rates have been achieved by concurrent use of an arch-shaped magnetic field that is superimposed over the electrical field and formed in a closed loop configuration over the surface of the target. These methods are known as magnetron sputtering methods. The arch-shaped magnetic field traps electrons in an annular region adjacent the target material surface thereby increasing the number of electron-gas atom collisions in the annular region to produce an increase in the number of positively charged gas ions in the region that strike the target to dislodge the target material. Accordingly, the target material becomes eroded (i.e., consumed for subsequent deposition on the substrate) in a generally annular section of the target face, known as the target raceway. Magnetron sputtering imposes considerable thermal energy upon the sputter target assembly, especially within the concentrated annular region of the target raceway. The corresponding temperature variations within the target assembly induce forces which encourage separation of the target material from the backing plate material; this is especially true with regard to the peripheral zone of the target assembly.

In order to achieve good thermal and electrical contact between the target material and backing plate material, these members are commonly bonded to one another by means of soldering, brazing, diffusion bonding, clamping and by epoxy cement and the like. These bonding methods typically involve imposition of high temperatures. Sputter target assemblies bonded by these methods can bow or bend at high sputtering rates, especially when a large difference exists between the coefficients of thermal expansion for the target material and backing plate material. In many cases, in order to minimize bowing and bending at high sputtering conditions, target materials and backing plate materials having similar thermal expansion coefficients are utilized. In sputter target assemblies with internal cooling channels, bowing and bending induces leakage; the typical bonding methods, described above, tend to deform, or otherwise partially constrict, the cooling channels. Additionally, known bonding techniques, as discussed above, result in undesirable grain growth in the target material or the resulting bond cannot withstand the stresses imposed by high sputtering rates.

In some prior art target assemblies, projections formed in either the interfacial surfaces of the target material or backing plate material are received in corresponding recesses or grooves of the other member to improve thermal conductivity. For example in Hillman U.S. Pat. No. 4,885,075, annularly arranged members of high thermal conductivity protrude from either the target material or backing plate material into a corresponding recess formed in the other member. Upon heating of the target assembly during sputtering, the protruding members expand radially to make contact with the recess wall to thereby improve heat transfer between the target material and the backing plate material.

Elastic and plastic deformation of backing plate members in target assemblies is minimized in accordance with U.S. Pat. No. 5,269,899 (Fan), of common assignment herewith, by the provision of mating teeth like projections disposed along the target material/backing plate material interfacial surfaces, with the mating surface of the backing plate material having a concave surface. Here again, upon heating of the target assembly, the target material teeth expand radially and make snug contact with the mating teeth on the backing plate material to enhance thermal conductivity.

U.S. Pat. No. 5,230,459 (Mueller et al.) of common assignment herewith teaches the use of diffusion bonding methods wherein one of the target material/backing plate material mating surfaces is first prepared with grooves or the like. During the diffusion bonding process, jagged portions of the grooves penetrate into the metal from the opposed interfacial surface and disrupt the formation of oxide and other bond inhibiting layers that may otherwise form along the target material/backing plate material interface to thereby improve bonding efficacy. The method results in a strong bond with increased shear resistance such that the target assembly can withstand thermal stress that otherwise may tend to result in debonding or target assembly warpage during use.

As stated above, the induced separation forces tend to concentrate adjacent a peripheral zone of the target assembly. Prior art joining techniques employ a conventional weld around the periphery of the interface of the target material and backing plate material. For the reasons mentioned above, conventional welding techniques, even along only the periphery zone, are undesirable.

Therefore, there remains a need in the art of sputter target assemblies for a method of bonding the target material to the backing plate material which will withstand the stresses imposed by high sputtering rates, will allow for use of materials with dissimilar thermal expansion characteristics, and will not induce grain growth or cooling channel deformation. Specifically, improvement in the bond strength at the periphery is desirable.

SUMMARY OF THE INVENTION

The primary objective of the present invention is to provide low temperature pressure consolidation methods for bonding target material to backing plate material wherein the methods produce bonds capable of withstanding the stresses imposed by high sputtering rates. The preferred sputter target assemblies in accordance with the present invention are comprised of target materials and backing plate materials having dissimilar thermal expansion coefficients and incorporate a peripheral mechanical bond joining the target material and backing plate material.

Although the preferred target material and backing plate material have dissimilar thermal expansion coefficients, the bonding methods of the present invention allow these unconventional assemblies to be bonded together and used at high sputtering rates without significant bowing or bending and without separation adjacent the periphery. Additionally, the low temperature pressure consolidation methods of the present invention do not cause undesirable grain growth of the target material during bonding of the target material with the backing plate material. The bonding methods of the present invention have been found to be particularly useful with regard to joining titanium (Ti) materials with aluminum (Al) materials; welding of such materials to one another imparts formation of brittle intermetallic compounds.

A second objective of the present invention provides for simplification of joining the target material and backing plate material free of conventional welding or high temperature bonding techniques. In most cases, the circumferentially extending mechanical bond in accordance with the present invention along the periphery zone provides sufficient resistance to separation. In cases where increased bond strength is desired, a series of interlocking protruding portions are formed in the target material or backing plate material mating surface and become imbedded in the mating material subsequent to being low temperature pressure consolidated. In an alternate embodiment, grooves can be formed in the opposing mating surface, designed to receive the protruding portions and provide additional mechanical interlocking, with additional bonding strength, between the target and backing plate material.

After the target material and backing plate material are bonded together by the low temperature consolidation methods as described above, the target assembly is machined to the desired dimensions.

Other advantages and benefits of the present invention will become apparent with further reference to the appended drawings, the following detail description and the appended claims.

BRIEF DESCRIPTION OF THE DRAWINGS

FIG. 3 depicts a cross sectional view of a target assembly in accordance with the present invention with a substantially rectangular shaped circumferentially extending lip subsequent to the low temperature pressure consolidation and machining steps;

FIG. 4 depicts a cross sectional view of the preferred get assembly in accordance with the present invention with a substantially triangular shaped circumferentially extending lip subsequent to the low temperature pressure consolidation and machining steps;

DETAILED DESCRIPTION OF THE INVENTION

Figure 1:
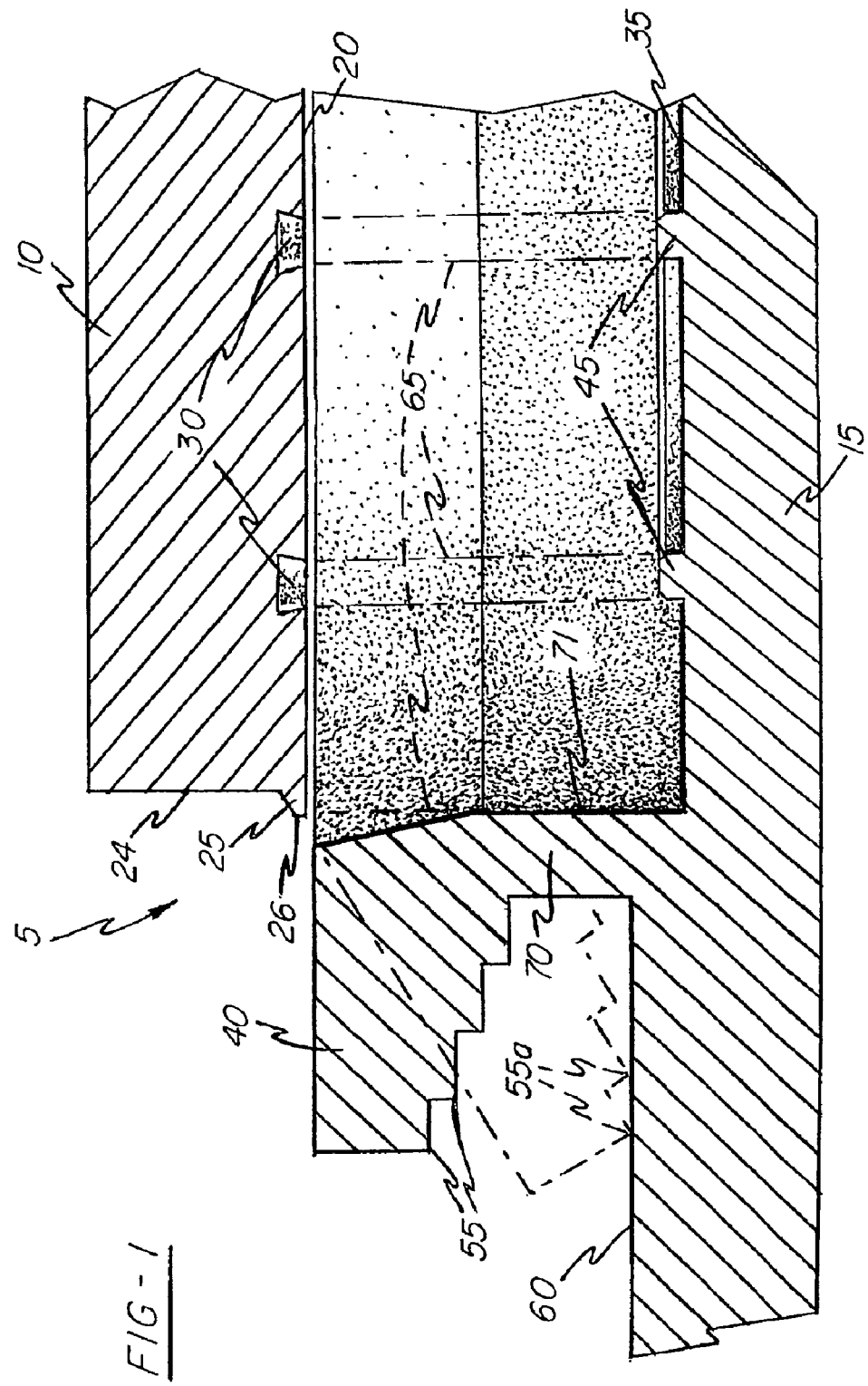
FIG. 1 depicts a cross sectional view of the preferred target assembly in accordance with the present invention prior to the low temperature pressure consolidation step.

Referring initially to FIG. 1, target assembly 5 in accordance with the present invention is depicted prior to the target material 10 being low temperature pressure consolidated with backing plate material 15. As shown, the target material is first formed to be substantially disc shape and the backing plate material is formed to receive the target material within. Exemplary target materials comprise, Al, Cu, Ti, Co, and their alloys. Exemplary backing plates may comprise Al, stainless steel, Cu, Ti, and their alloys.

The target material 10 is formed to include a mating surface 20 with tapered grooves 30 and a side portion 24. The target material is further formed to include a lip 25 extending from the side portion 24. The lip 25 is substantially rectangular in cross section with tip 26 defining the outer most edge of the target material in a radial direction.

The backing plate material 15 is formed to include a mating surface 35 with protruding portions 45 extending therefrom. The backing plate material 15 further includes a clamp 40 with corresponding retaining surface 60. The clamp 40 includes a base portion 70 with wall 71 and steps 55.

As shown with dashed lines 65, the target material 10 and backing plate material 15 are formed such that the tip 26 aligns with wall 71 and the protruding portions 45 align with corresponding grooves 30. The protruding portions 45 and grooves 30 can extend parallel to the corresponding mating surface 20, 35 to form circular patterns, rows or combinations thereof. The preferred steps 55 facilitate formation of the mechanical bond, in accordance with the present invention as described herein.

The preferred mechanical bond in accordance with the present invention is formed with application of force parallel to wall 71 only. The deformed steps 55a, as shown in phantom in FIG. 1, engage the retaining surface 60 such that force exerted parallel to wall 71 will induce deflection of wall 71 toward side portion 24. Optionally, in accordance with the present invention, a secondary force may be exerted perpendicular to wall 71 to impart deflection of wall 71 toward side portion 24. Various shaped clamps can be employed in accordance with the present invention, most preferably, the clamp is designed to induce deflection of wall 71 toward side portion 24 with application of force parallel to wall 71 only. Formation of the mechanical bond in accordance with the present invention, utilizing application of force parallel to wall 71 only, simplifies the required manufacturing process and limits the required equipment.

Figure 2:
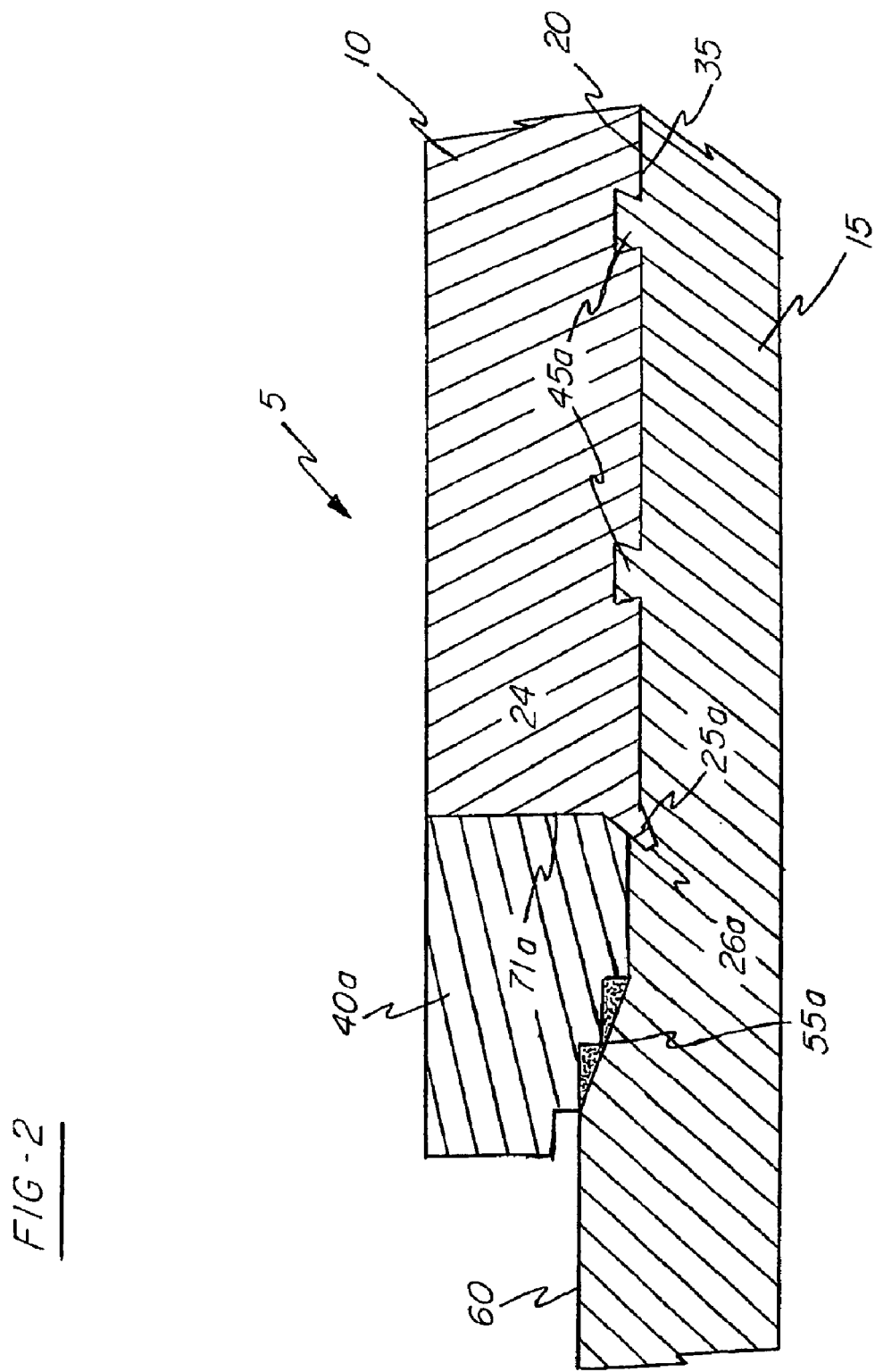
FIG. 2 depicts a cross sectional view of the target assembly of FIG. 1 subsequent to the low temperature pressure consolidation step.

Turning now to FIG. 2, the clamp 40 is depicted to have cooperated with the lip 25 to form a mechanical bond around the periphery of the target material 10. The target and backing plate materials have been subjected to low temperature pressure consolidation such that the deformed steps 55a of deformed clamp 40a engage retaining surface 60. Upon being subjected to low temperature pressure consolidation, the deformed base portion 70a deflects such that deformed wall 71a engages side portion 24, trapping the deformed lip 25a stherebeneath.

The deformed tip 26a of the deformed lip 25a is forced, slightly, into the backing plate material. The combination of the deformed wall 71a engaging side portion 24 and the deformed base portion 70a trapping the deformed lip 25a forms the desired mechanical bond around the periphery of the target material 10 and the backing plate material 15. The substantially rectangular lip 25, as shown in FIG. 3, becomes deformed such that tip 26a of the deformed lip 25a is substantially embedded into the backing plate material.

Turning now to FIG. 4, target assembly 105 is a preferred embodiment in accordance with the present invention with a deformed lip 125a which is substantially triangular in cross section. With further reference to FIG. 4, it can be that the target material 110 with mating surface 120 and backing plate material 115 with mating surface 135 have been subjected to low temperature pressure consolidation such that deformed protruding portion 145a has been received within the corresponding groove such that material 145b is trapped within. The deformed substantially triangular lip 125a has been trapped beneath the deformed base portion 170a such that the tip 126a is not embedded within backing plate material 115 to the degree that tip 26a is embedded into backing plate material 15.

The lip can be formed to include a number of various cross sectional shapes in accordance with the present invention. Various shaped lips have been found to result in more or less deflection in the tip and embedment within the backing plate material. It has been found that excessive deflection may cause cracking of the backing plate material adjacent the tip, therefore, the optimum lip cross sectional shape will depend upon the given materials.

Target assemblies in accordance with the present invention may be produced free of protruding portions and free of grooves; however, incorporation of protruding portions and, or, grooves imparts improved bond strength, electrical conductivity and thermal conductivity between the target material and backing plate material.

With further reference to FIG. 2, target assembly 5 is shown subsequent to the target material 10 and backing plate material 15 being low temperature pressure consolidated. As can be seen, mating surfaces 20, 35 engage one another with mechanical interlocks 45a being formed from the reception, and deformation, of protruding portions 45 within tapered grooves 30.

Figure 5:
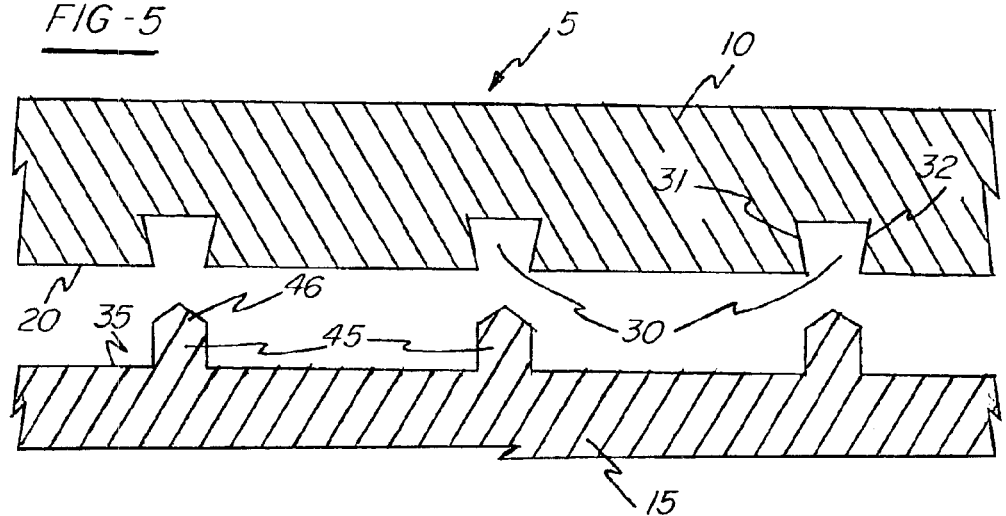
FIG. 5 depicts a cross sectional view of a target assembly in accordance with the present invention showing mechanical interlocking protruding portions and grooves prior to the low temperature pressure consolidation step.
Figure 6:
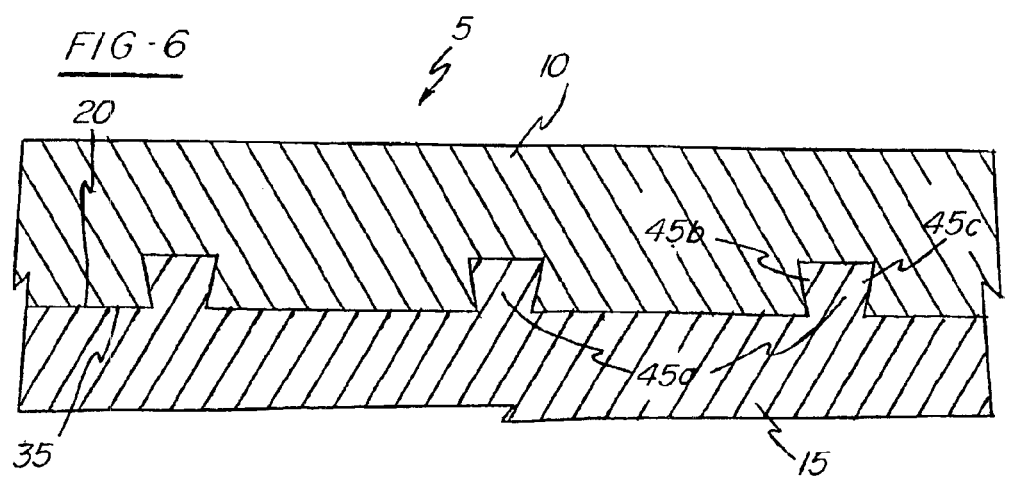
FIG. 6 depicts a cross sectional view of the target assembly of FIG. 3 subsequent to the low temperature pressure consolidation step.

As can be seen additionally referring to FIGS. 5 and 6, the preferred protruding portion 45 shape has a substantially triangular shaped tip 46. The preferred tapered groove 30 shape, as shown in FIGS. 1–6, is trapezoidal. With the preferred shaped protruding portions 45 and grooves 30, the deformed protruding portion 45a will mate with the corresponding grooves 30 such that trapped material 45b, 45c is forced within groove voids 31, 32 forming a mechanical interlock between the target material 10 and backing plate material 15. The protruding portions 45 and grooves 30 may take on a number of mating shapes in accordance with the present invention, however, most preferably the volume of material associated with a given protruding portion 45 is matched with the volume associated with the corresponding groove 30 such that the deformed protruding portion 45a substantially fills the entire groove.

With further reference to FIGS. 3 and 4, the respective target assembly 5, 105 is depicted subsequent to being subjected to a machining operation. As can be seen, the given target assembly 5, 105 is machined such that only a section of the deformed base portion 70a, 170a remains; a section of the target material 10, 110 is removed as well. The corresponding mechanical bond remains with the deformed lip 25a, 125a trapped beneath the remaining section of the deformed base 70a, 170a. Various amounts of material may be machined away from the target material and backing plate material within the scope of the present invention.

The phrase "low temperature pressure consolidation" refers to pressure consolidation that may occur at temperatures of less than about 50% of the melting temperature of the lower melting point of either the target material 10 or backing plate material 15. Preferably, the application of pressure of about 50–5,000 tons is performed; most preferably less than about 1,000 tons, at about room temperature to about 150° C.; more preferably below 100° C.; even more preferably at less than 38° C. The protruding portions 45 are preferably formed in the softer material of either the target material 10 or backing plate material 15 with the tapered grooves being formed in the opposing mating material.

The target material and backing plate material may be low temperature pressure consolidated such that the deformation of the protruding portions and formation of the mechanical bond occur simultaneously or, most preferably, the protruding portions are deformed in an initial low temperature pressure consolidation step followed by a second low temperature pressure consolidation step forming the mechanical bond. In accordance with the present invention, deformation of the protruding portions may occur at a pressure, and or, temperature different from the corresponding formation of the mechanical bond.

Figure 7:
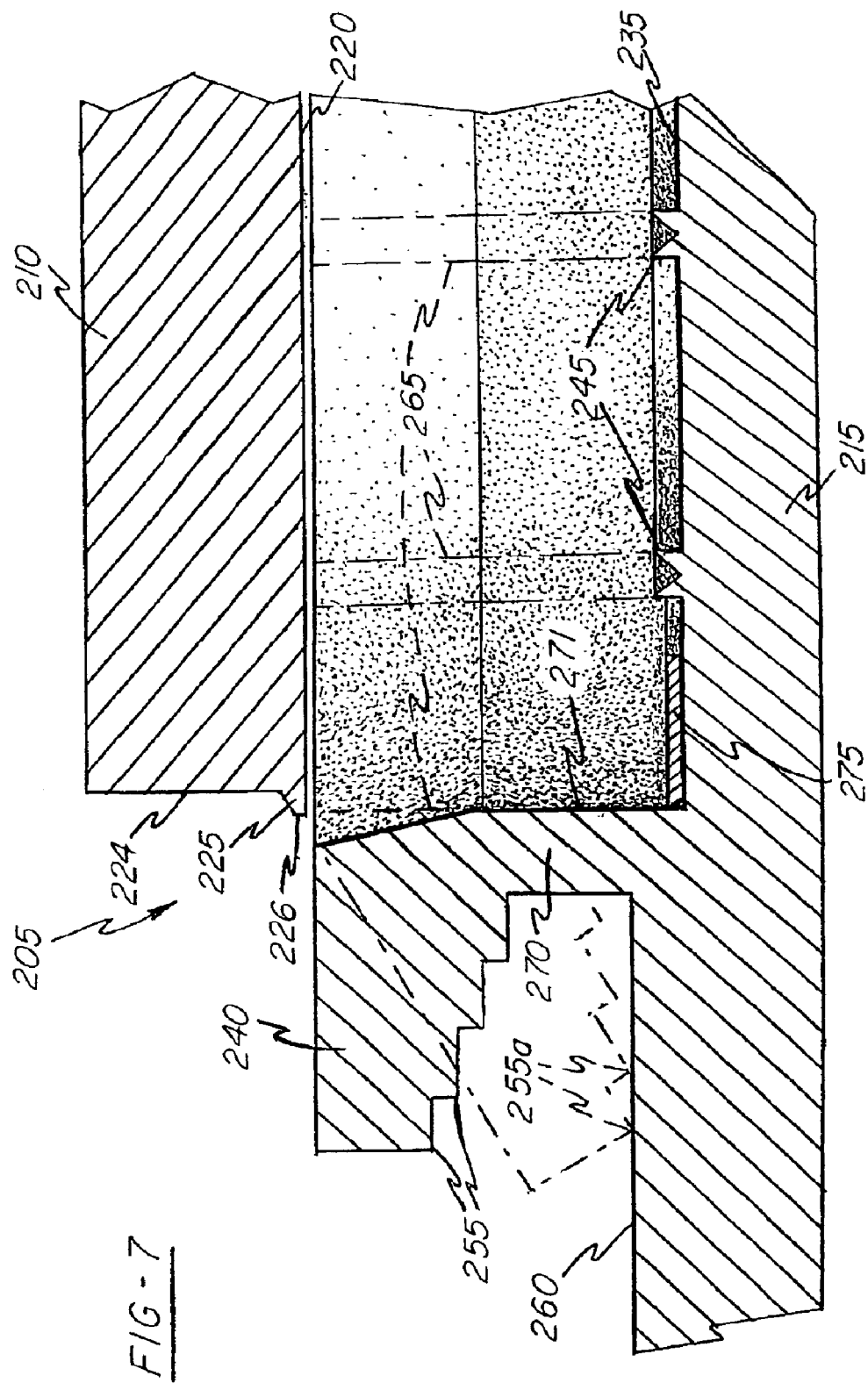
FIG. 7 depicts a cross sectional view of a target assembly in accordance with the present invention, having "M" shaped protrusions and addition of interposing material adjacent the periphery, prior to the low temperature pressure consolidation step.
Figure 8:
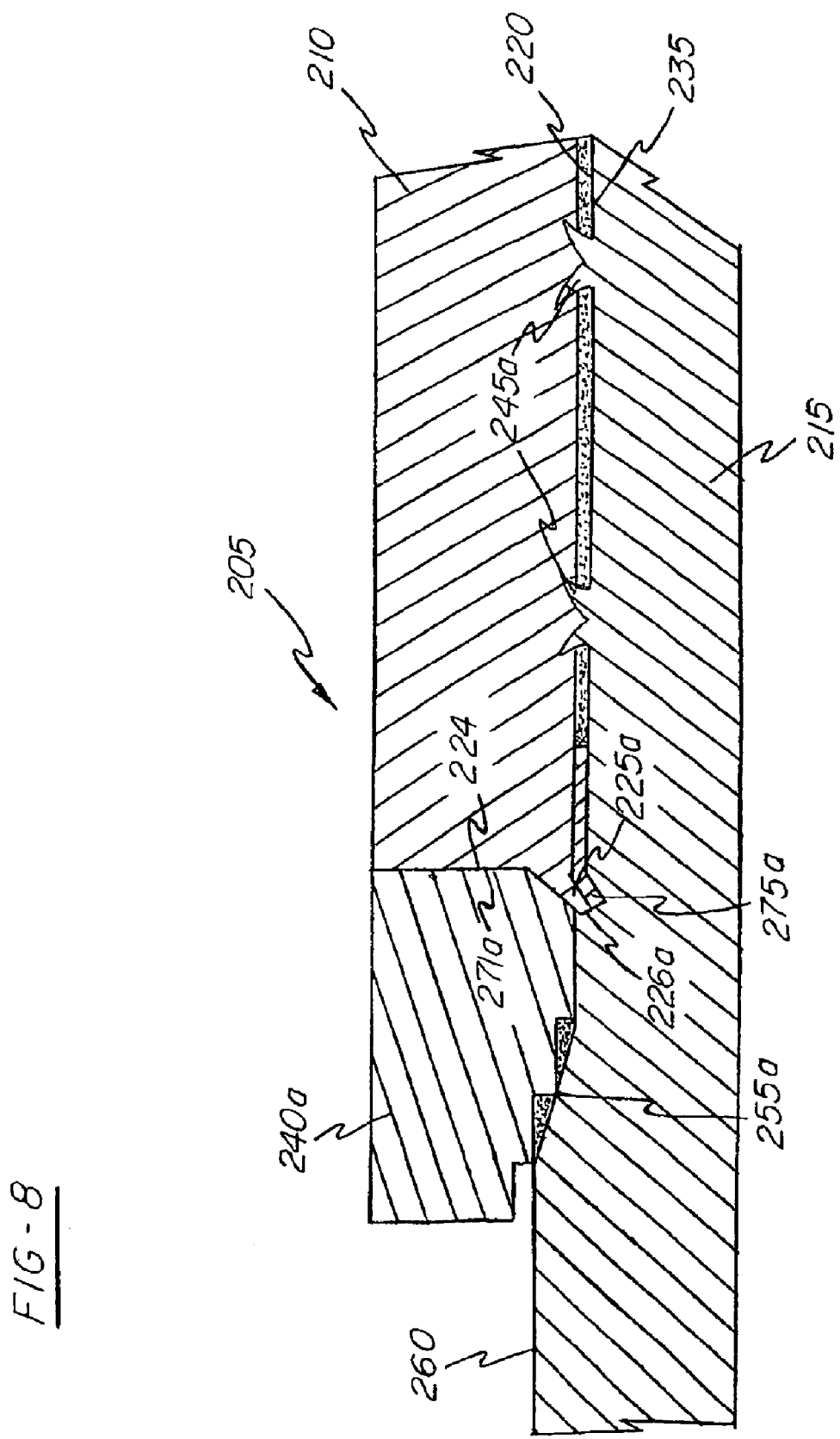
FIG. 8 depicts a cross sectional view of the target assembly of FIG. 7 subsequent to the low temperature pressure consolidation step.

Turning now to FIGS. 7 and 8, an alternate embodiment in accordance with the present invention is shown as target assembly 205. As can be seen, target assembly 205 include interposing material 275 positioned adjacent the intersection of wall 271 and mating surface 235. Incorporation of interposing material 275 assists in inhibiting oxidation of mating surfaces 220, 235.

Target material 210 is formed to include mating surface 220 and side portion 224 with lip 225 extending therefrom. The tip 226 of lip 225 defines the outer most edge of the target material in the radial direction.

Backing plate material 215 is formed with "M" shaped protruding portions extending from mating surface 235 and clamp 240. Clamp 240 is formed to include steps 255 and base portion 270 having wall 271.

Upon imposition of low temperature pressure consolidation, the protruding portions 245 become embedded within the target material defining deformed "M" shaped protruding portions 245a producing a mechanical interlock between the target material and the backing plate material. The deformed steps 255*a* of the deformed clamp 240*a* engage retaining surface 260 such that deformed base portion 270*a* deflects toward side portion 224. The deformed wall 271*a* is forced against side portion 224 and traps the deformed lip 225*a* and deformed interposing material 275*a* therebeneath. Preferably, the lip is shaped such that the deformed tip 226*a* becomes slightly embedded into the backing plate material.

What is claimed is:

1. A method of manufacturing a sputter target assembly comprising the steps of:
   (a) providing a target having a target sidewall and a lip member protruding from said sidewall;
   (b) providing a backing plate having a backing plate side all and a retaining surface adjacent the backing plate sidewall thereby defining a backing plate recess adapted for snug reception of said target therein;
   (c) providing a clamp member in said backing plate adjacent said backing plate sidewall;
   (d) inserting said target within said recess with said target sidewall adjacent said backing plate sidewall; and
   (e) applying a force to said clamp to deflect said backing plate sidewall toward said target sidewall to thereby embed said lip into said backing plate sidewall to form a mechanical bond thereat.

2. A method as recited in claim 1 wherein said steps (d) and (e) are both carried out at a temperature of less than about 100° C.

3. A method as recited in claim 2 further comprising providing a target mating surface on an underside of said target surrounded by said target sidewall and providing a backing plate mating surface in said backing plate recess surrounded by said backing plate sidewall, providing one of said mating surfaces with a plurality of protruding portions and the other of said mating surfaces with a plurality of corresponding grooves, and forming second mechanical bonds between said protruding portions and said grooves upon application of said low temperature pressure consolidation conditions.

4. Method as recited in claim 3 wherein said target comprises Al, Cu, Ti, Co, or alloys thereof.

5. Method as recited in claim 4 wherein said backing plate comprises Al, stainless steel, Cu, Ti, or alloys thereof.

6. A method as recited in claim 2 wherein said temperature is less than about 38° C.

7. A method as recited in claim 6 wherein said temperature is about room temperature.

8. A method as recited in claim 1 further comprising (f) providing a series of steps in said clamp member, said steps engaging said backing plate retaining surface upon said step (e).

9. A sputter target assembly comprising:
   (a) a target, a target sidewall depending from said get, and a lip protruding from said target sidewall;
   (b) a backing plate, a backing plate sidewall formed in aid backing plate and a backing plate retaining surface adjacent said backing plate sidewall, said retaining surface and said backing plate sidewall defining a recess adapted for snug reception of said target therein with said target sidewall adjacent said backing plate sidewall; and
   (c) a clamp member in said backing plate adjacent said backing plate sidewall, said lip being embedded within said backing plate sidewall forming a first mechanical bond thereat.

10. A sputter target assembly as recited in claim 9 further comprising steps in said clamp member, said steps being engaged with said backing plate retaining surface.

11. A sputter target assembly as recited in claim 9 further comprising a target mating surface on an underside of said target surrounded by said target sidewall, a backing plate mating surface in said backing plate recess and surrounded by said backing plate sidewall, a plurality of protruding surfaces formed in one of said mating surfaces, a plurality of corresponding grooves formed in the other mating surface, said protruding surfaces extending into said grooves and forming a plurality of second mechanical bonds between said protruding surfaces and said grooves.

12. A sputter target assembly as recited in claim 11 wherein said target comprises Al, Cu, Ti, Co, or alloys thereof.

13. A sputter target assembly as recited in claim 12 wherein said backing plate comprises Al, stainless steel, Cu, Ti, or alloys thereof.

* * * * *

UNITED STATES PATENT AND TRADEMARK OFFICE
CERTIFICATE OF CORRECTION

| | |
|---|---|
| PATENT NO. | : 7,146,703 B2 |
| APPLICATION NO. | : 10/433181 |
| DATED | : December 12, 2006 |
| INVENTOR(S) | : Eugene Y. Ivanov |

It is certified that error appears in the above-identified patent and that said Letters Patent is hereby corrected as shown below:

Column 7, line 15, please correct "side all" to --sidewall--.

Column 8, line 10, please correct "get" to --target--.

Column 8, line 12, please correct "aid" to --said--.

Signed and Sealed this

Twenty-seventh Day of February, 2007

JON W. DUDAS
*Director of the United States Patent and Trademark Office*